(12) United States Patent
Izumida et al.

(10) Patent No.: US 8,110,864 B2
(45) Date of Patent: Feb. 7, 2012

(54) NONVOLATILE SEMICONDUCTOR MEMORY DEVICE

(75) Inventors: Takashi Izumida, Kanagawa-ken (JP); Masaki Kondo, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 314 days.

(21) Appl. No.: 12/327,418

(22) Filed: Dec. 3, 2008

(65) Prior Publication Data

US 2009/0146203 A1 Jun. 11, 2009

(30) Foreign Application Priority Data

Dec. 3, 2007 (JP) ................. 2007-312124

(51) Int. Cl.
*H01L 29/778* (2006.01)
(52) U.S. Cl. .............. 257/316; 257/E27.103; 257/E29.3
(58) Field of Classification Search .......... 257/314–317, 257/194, 195, 261, 369, E21.679, E21.681, 257/E2.407, E21.403, E29.247, E29.246, 257/E29.129, E29.304, E29.302, E29.3, E29.248, 257/E27.203, 321, E27.103; 438/257
See application file for complete search history.

(56) References Cited

U.S. PATENT DOCUMENTS

| | | | |
|---|---|---|---|
| 5,923,976 A | 7/1999 | Kim | |
| 7,026,684 B2 | 4/2006 | Sakuma et al. | |
| 7,298,006 B2 | 11/2007 | Arai et al. | |
| 7,495,282 B2 * | 2/2009 | Orimoto et al. | 257/315 |
| 7,615,445 B2 * | 11/2009 | Chien et al. | 438/257 |
| 2005/0003616 A1 * | 1/2005 | Lutze et al. | 438/258 |
| 2005/0087795 A1 * | 4/2005 | Sakuma et al. | 257/315 |
| 2005/0207226 A1 * | 9/2005 | Yuan | 365/185.17 |
| 2006/0284242 A1 * | 12/2006 | Jo | 257/316 |
| 2008/0012061 A1 * | 1/2008 | Ichige et al. | 257/315 |
| 2008/0105916 A1 * | 5/2008 | Watanabe | 257/315 |
| 2008/0239827 A1 * | 10/2008 | Mokhlesi | 365/185.28 |
| 2008/0248622 A1 * | 10/2008 | Matamis et al. | 438/261 |
| 2008/0268596 A1 * | 10/2008 | Pham et al. | 438/261 |
| 2009/0258473 A1 * | 10/2009 | Koh et al. | 438/424 |

* cited by examiner

*Primary Examiner* — Matthew Landau
*Assistant Examiner* — Latanya N Crawford
(74) *Attorney, Agent, or Firm* — Turocy & Watson, LLP

(57) ABSTRACT

In one aspect of the present invention, a nonvolatile semiconductor memory device may include a semiconductor substrate; a plurality of tunnel insulating films formed on the semiconductor substrate at predetermined intervals in a first direction; a plurality of floating gate electrodes each having a first portion and a second portion, the first portions being formed on the respective tunnel insulating films, the second portions being formed on the respective first portions and having smaller width than the first portions in the first direction; an inter-gate insulating film formed on the floating gate electrodes; and first and second control gate electrodes respectively formed on sidewalls, in the first direction, of the second portion of each of the plurality of floating gate electrodes with the inter-gate insulating film interposed therebetween.

20 Claims, 19 Drawing Sheets

FIG. 9A
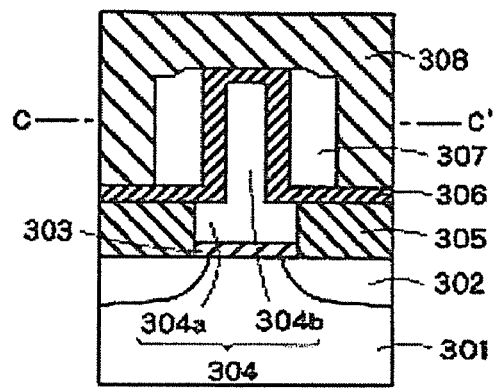
FIG. 9B
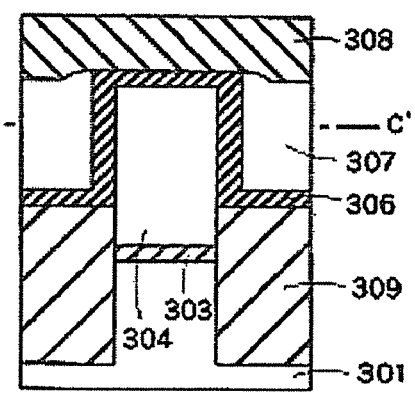
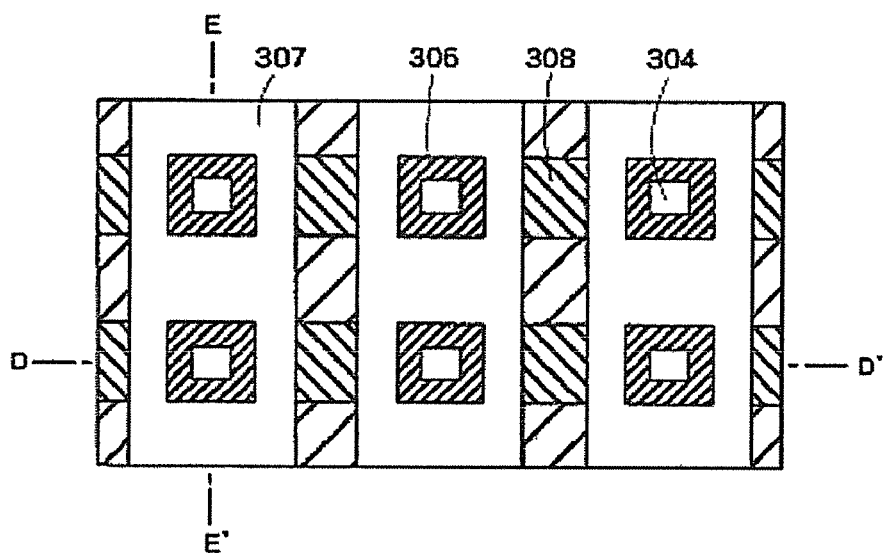
FIG. 9C

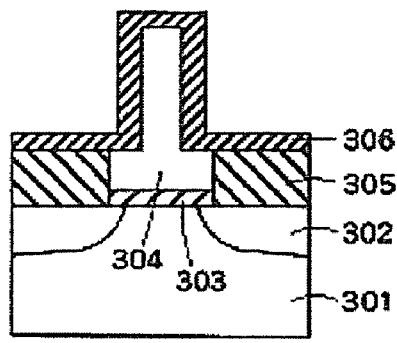
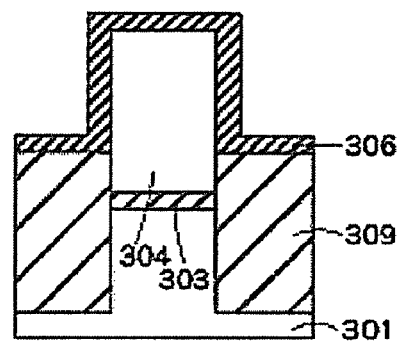
FIG. 10A          FIG. 10B
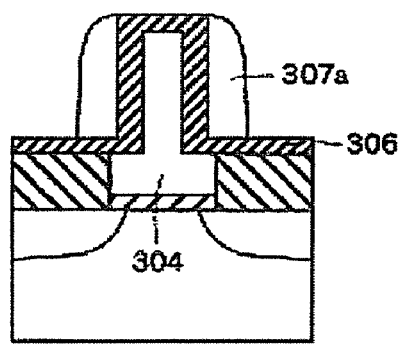
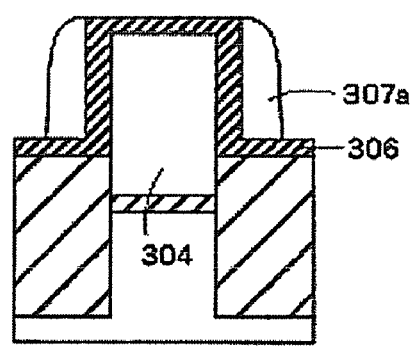
FIG. 10C          FIG. 10D

NONVOLATILE SEMICONDUCTOR MEMORY DEVICE

CROSS REFERENCE TO RELATED APPLICATION

This application is based upon and claims the benefit of priority from Japanese Patent Application No. 2007-312124, filed on Dec. 3, 2007, the entire contents of which are incorporated herein by reference.

BACKGROUND

Suppressing short channel effect in a NAND-type flash memory cell may be increasing its effective channel length by increasing impurity concentration in a substrate while reducing impurity concentration in diffusion layers in the cell.

However, reduction in impurity concentration in diffusion layers will increase a resistance value in a NAND string, and thus lower the saturation current in each cell. This increases a voltage difference between on/off discrimination currents and thus increases time required for each reading operation.

The conventional NAND-type flash memory may have a problem that it is difficult to suppress short channel effect while reducing a voltage difference between on/off discrimination currents therein.

SUMMARY

Aspects of the invention relate to an improved nonvolatile semiconductor memory device In one aspect of the present invention, a nonvolatile semiconductor memory device may include a semiconductor substrate; a plurality of tunnel insulating films formed on the semiconductor substrate at predetermined intervals in a first direction; a plurality of floating gate electrodes each having a first portion and a second portion, the first portions being formed on the respective tunnel insulating films, the second portions being formed on the respective first portions and having smaller width than the first portions in the first direction; an inter-gate insulating film formed on the floating gate electrodes; and first and second control gate electrodes respectively formed on sidewalls, in the first direction, of the second portion of each of the plurality of floating gate electrodes with the inter-gate insulating film interposed therebetween.

In another aspect of the present invention, a nonvolatile semiconductor memory device may include a semiconductor substrate; a plurality of tunnel insulating films formed on the semiconductor substrate at predetermined intervals in a first direction; a plurality of floating gate electrodes each having a first portion and a second portion, the first portions being formed on the respective tunnel insulating films, the second portions being formed on the respective first portions and having smaller width than the first portions in the first direction; an inter-gate insulating film formed on the floating gate electrodes; and a control gate electrode formed over a top and sidewalls, in the first direction, of the second portion of each of the plurality of floating gate electrodes with the inter-gate insulating film interposed therebetween, the control gate electrode having a band shape extending in a second direction perpendicular to the first direction.

BRIEF DESCRIPTION OF DRAWINGS

FIGS. 9A and 9B respectively show longitudinal sections taken in the bit-line and word-line directions of a nonvolatile semiconductor memory device according to a third embodiment of the present invention. FIG. 9C shows a horizontal section taken along the C-C' line of the FIGS. 9A and 9B.

DESCRIPTION OF THE PREFERRED EMBODIMENTS

Hereinafter, description will be given of a nonvolatile semiconductor memory device according to embodiments of the present invention, with reference to the drawings.

First Embodiment

Figure 1A:
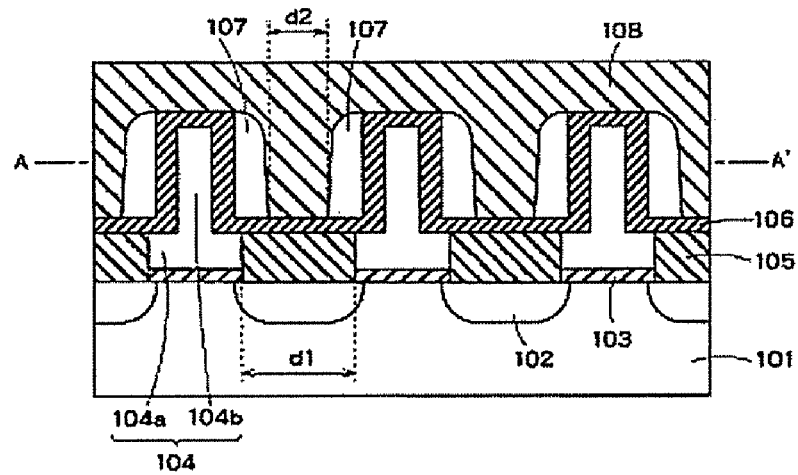
FIG. 1A shows a longitudinal section of a nonvolatile semiconductor memory device according to a first embodiment of the present invention in the bit-line direction thereof.

FIG. 1A shows a longitudinal section of a nonvolatile semiconductor memory device according to a first embodiment of the present invention in the bit-line direction thereof. Diffusion layers 102 are formed in the upper surface of a semiconductor substrate 101 at predetermined intervals. On portions, between the diffusion layers 102, of the semiconductor substrate 101, inverted-T floating gate electrodes 104 are formed with tunnel insulating films 103 interposed therebetween, respectively.

Each floating gate electrode 104 has a first portion 104a and a second portion 104b. The length in the bit-line direction of the first portion 104a is approximately the same as that of the tunnel insulating film 103 while that of the second portion 104b is shorter than this length.

An insulating film 105 is formed between each adjacent two floating gate electrodes 104 (that is, on each diffusion layer 102), and an inter-gate insulating film (inter-poly insulating film) 106 is formed to cover the insulating films 105, the second portions 104b of the floating gate electrodes 104 and the upper surfaces of the first portions 104a thereof.

A control gate electrode 107 is formed on each sidewall of the floating gate electrodes 104 with the inter-poly insulating film 106 interposed therebetween. In addition, an insulating film 108 is formed to cover the control gate electrodes 107 and the inter-poly insulating film 106.

Figure 1B:
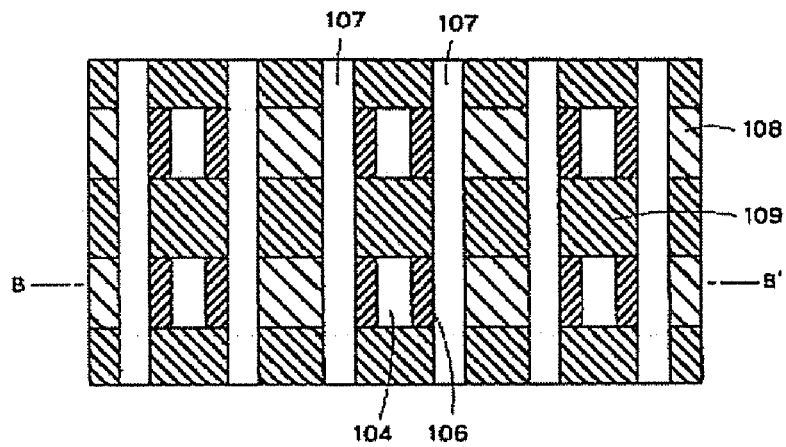
FIG. 1B shows a horizontal section taken along the A-A' line of the FIG. 1A.

FIG. 1B shows a horizontal section taken along the A-A' line of the FIG. 1A. The control gate electrodes 107 are formed on the respective side surfaces, in the horizontal direction of the FIG. 1B (bit-line direction), of the floating gate electrodes 104 with the inter-poly insulating film 106 interposed therebetween.

Each floating gate electrode 104 is isolated from the adjacent floating gate electrodes 104 in the vertical direction of the FIG. 1B (word-line direction) by element isolation regions 109 each having a shallow trench isolation (STI) structure. Note that the longitudinal section taken along the B-B' line of the FIG. 1B is equivalent to FIG. 1A.

Figure 2:
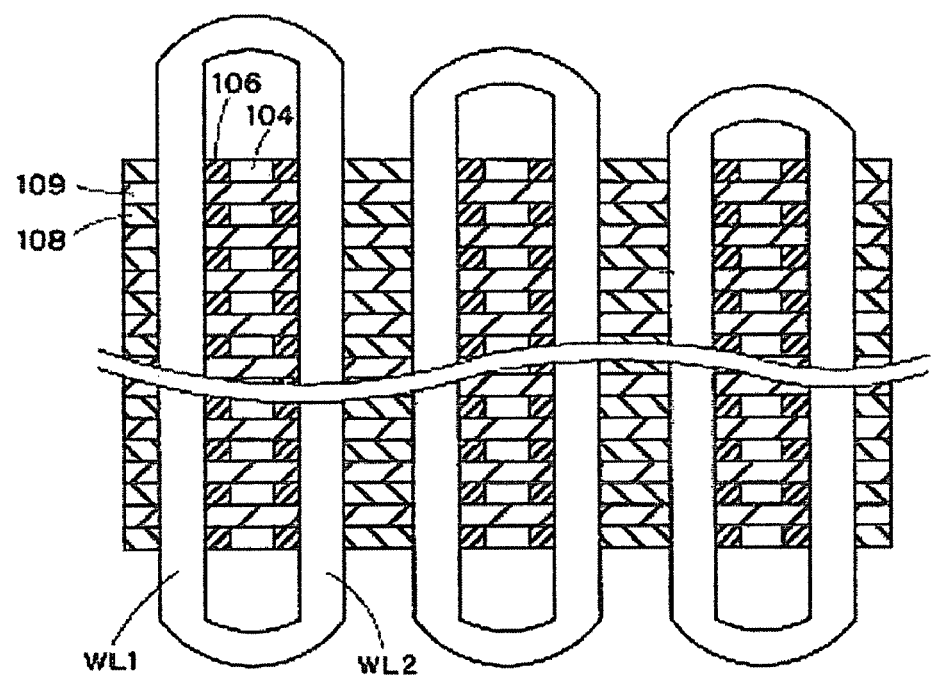
FIG. 2 is an overall view of a horizontal section of the nonvolatile semiconductor memory device.

FIG. 2 is an overall view of a horizontal section of the nonvolatile semiconductor memory device. A voltage is applied to each cell by means of two word lines (control gate electrodes) WL1 and WL2. Each end of the word line WL1 is connected to the adjacent end of the word line WL2, and the two word lines WL1 and WL2 apply the same voltage.

Figure 3:
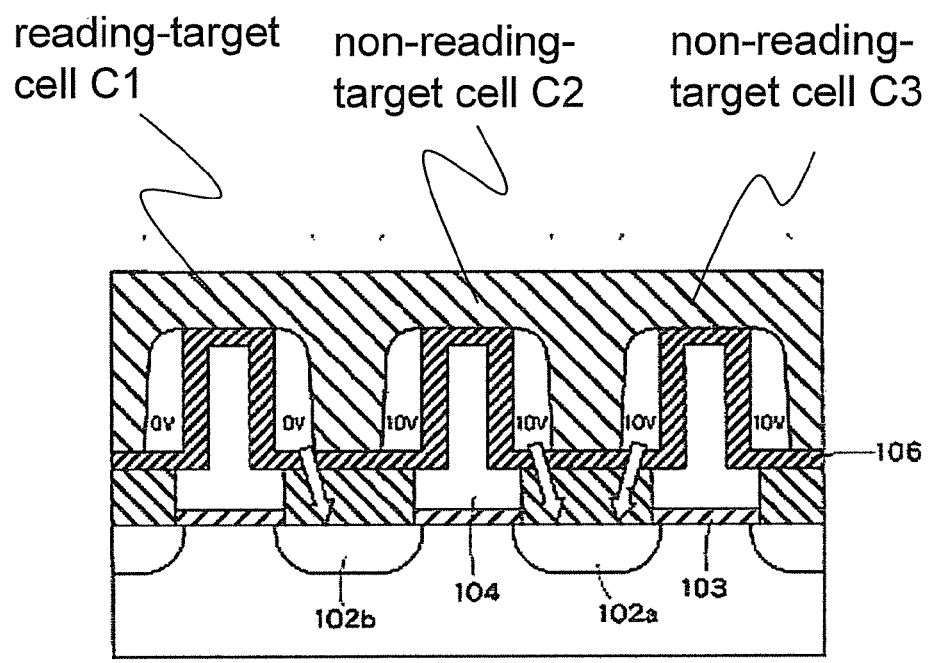
FIG. 3 shows an example of voltages applied to the nonvolatile semiconductor memory device during a reading operation.

FIG. 3 shows an example of voltages applied to the nonvolatile semiconductor memory device during a reading operation. A voltage of 0 V is applied to each control gate electrode 107 of a reading-target cell C1 while a voltage of 10 V is applied to each control gate electrode 107 of non-reading-target cells C2 and C3.

The potential of the diffusion layer 102a between the non-reading-target cells C2 and C3 is raised by components of a parasitic electric field from the control gate electrodes of the non-reading-target cells C2 and C3. Accordingly, even if the diffusion layer 102a has a low-impurity concentration, the resistance value thereof is lowered and thus a voltage difference between on/off discrimination currents can be reduced.

On the other hand, the potential of the diffusion layer 102b between the reading-target cell C1 and the non-reading-target cell C2 is lowered by components of a parasitic electric field from the control gate electrodes of the reading-target cells C1. This can make the effective channel length of the reading-target cell C1 longer and thus suppress short-channel effect.

As described above, forming control gate electrodes on both sides of each inverted-T floating gate electrode provides the following advantages. Specifically, since components of a parasitic electric field generated by voltages applied to the control gate electrodes can affect the potentials of the diffusion layers, short channel effect can be suppressed and thus a voltage difference between on/off discrimination currents can be reduced.

In FIG. 1A, each control gate electrode 107 has a bottom in which a region above the corresponding floating gate electrode 104 (first portion 104a) is smaller than the remaining region (a region facing the diffusion layer 102). The larger the latter region, the more largely components of a parasitic electric field generated by a voltage applied to the control gate electrode 107 affect the potential of the adjacent diffusion layer 102.

In other words, a distance d1 between each adjacent two floating gate electrodes 104 (that is, between each adjacent two tunnel insulating films 103) in the horizontal direction of FIG. 1A (bit-line direction) should preferably be longer than a distance d2 between each facing two control gate electrodes (word lines) 107. Note that each control gate electrode 107 does not necessarily extend outside the first portion 104a of the corresponding floating gate electrode 104.

Hereinafter, a manufacturing method of the nonvolatile semiconductor memory device according to this embodiment will be described by using process sectional views shown in FIGS. 4A to 5H. FIGS. 4A, 4C, 4E, 4G, 5A, 5C, 5E and 5G each show a longitudinal section taken in the bit-line direction while FIGS. 4B, 4D, 4F, 4H, 5B, 5D, 5F and 5H each show a longitudinal section taken in the word-line direction.

Figure 4A:
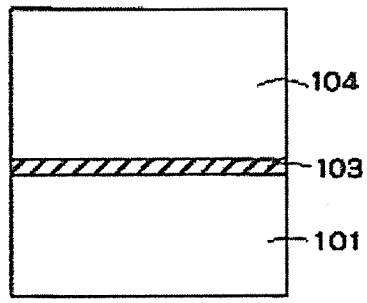
FIGS. 4A, 4C, 4E, 4G, 5A, 5C, 5E and 5G each show a longitudinal section taken in the bit-line direction while FIGS. 4B, 4D, 4F, 4H, 5B, 5D, 5F and 5H each show a longitudinal section taken in the word-line direction.
Figure 4B:
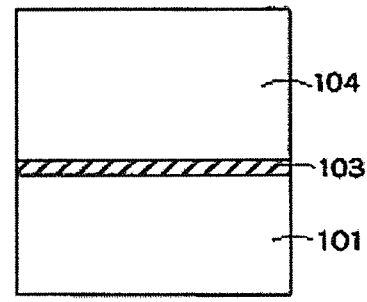

Firstly, as shown in FIGS. 4A and 4B, as the tunnel insulating film 103, a silicon dioxide film having a thickness of 8 nm is formed in the upper surface of the silicon substrate 101 by, for example, thermal oxidation. Then, as a charge accumulation film (floating gate electrode) 104, a polysilicon film having a thickness of 100 nm is deposited on the tunnel insulating film 103 by, for example, a chemical vapor deposition (CVD) method.

Figure 4C:
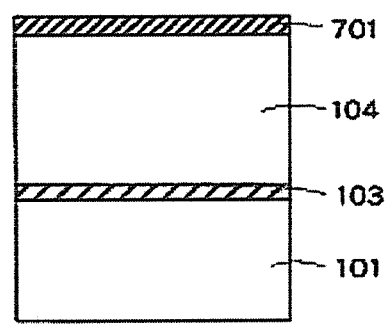
Figure 4D:
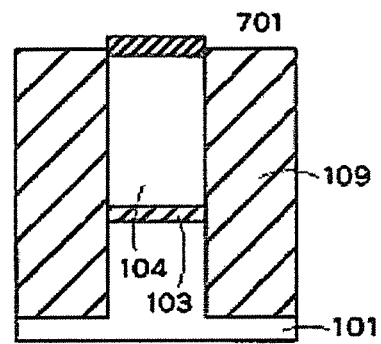

Thereafter, as shown in FIGS. 4C and 4D, an insulating film 701 made of, for example, a silicon nitride film is formed on the charge accumulation film 104, and then patterned to have band shapes extending in the bit-line direction at predetermined intervals. The charge accumulation film 104, the tunnel insulating film 103 and the silicon substrate 101 are partially removed by reactive ion etching (RIE) using the patterned insulating film 701 as a mask, and thereby trenches are formed.

Then, these trenches are filled with, for example, a silicon dioxide film, and thereby the element isolation regions 109 each having a STI structure is formed. After that, the element isolation regions 109 are planarized, and the insulating film 701 is removed in this process.

Figure 4E:
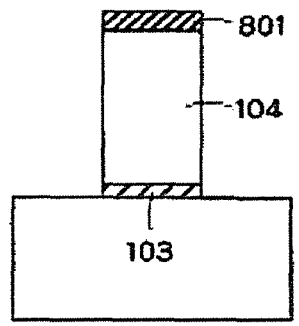
Figure 4F:
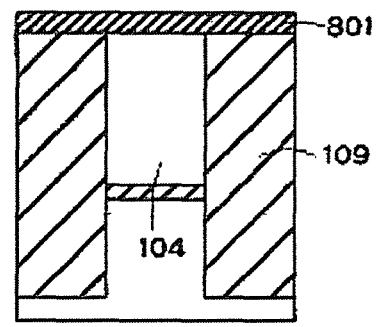

Thereafter, as shown in FIGS. 4E and 4F, an insulating film 801 made of, for example, a silicon nitride film is formed on the charge accumulation film 104 and the element isolation regions 109, and then patterned to have band shapes extending in the word-line direction at predetermined intervals. The charge accumulation film 104, the element isolation regions 109 and the tunnel insulating film 103 are partially removed by RIE using the patterned insulating film 801 as a mask.

Figure 4G:
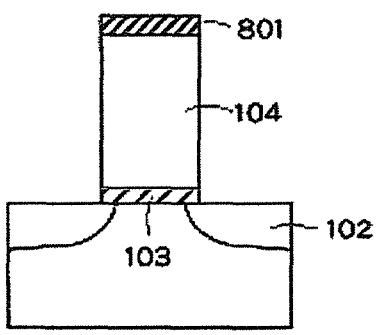
Figure 4H:
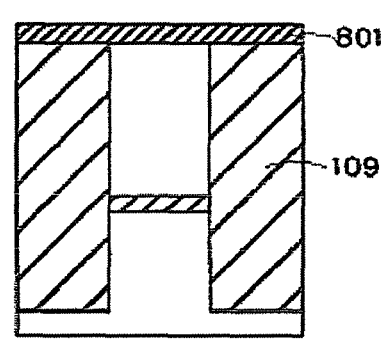

Then, as shown in FIGS. 4G and 4H, ions are implanted into the silicon substrate 101, and thereby the diffusion layers 102 are formed. In this ion implantation, arsenic ions are implanted so that the peak concentration thereof can be approximately $1 \times 10^{18}$ cm$^{-3}$, for example.

Figure 5A:
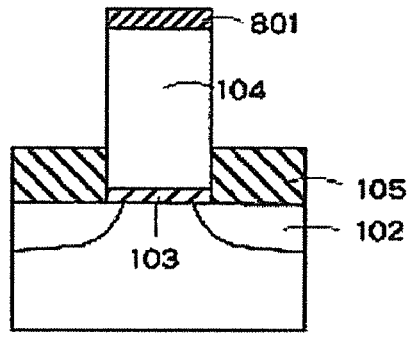
Figure 5B:
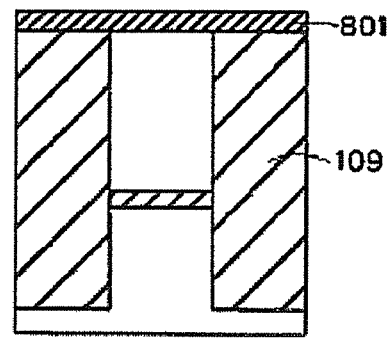

Thereafter, as shown in FIGS. 5A and 5B, a space between each adjacent two floating gate electrodes 104 is filled with the insulating film 105 made of, for example, a TEOS film, and the insulating films 105 are etched back to have a predetermined height.

Figure 5C:
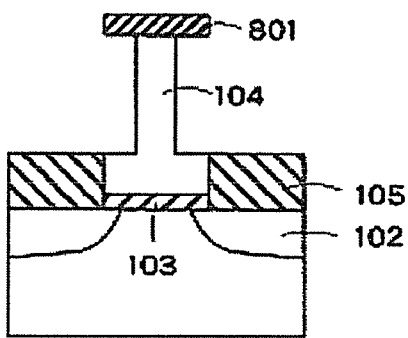
Figure 5D:
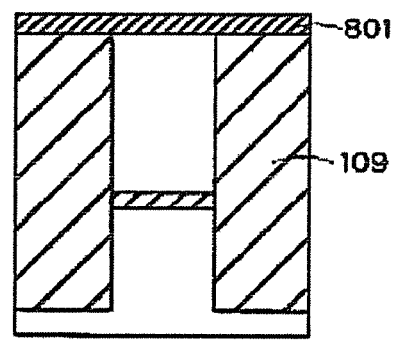

Then, as shown in FIGS. 5C and 5D, the charge accumulation film 104 is processed to have inverted-T shapes by side etching. After that, the insulating film 801 is removed.

Figure 5E:
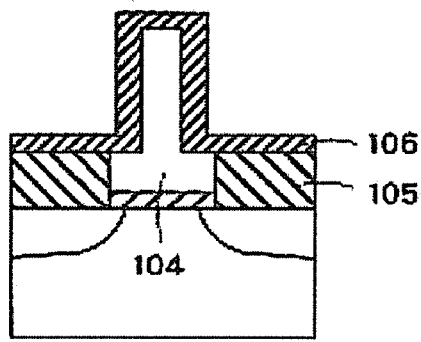
Figure 5F:
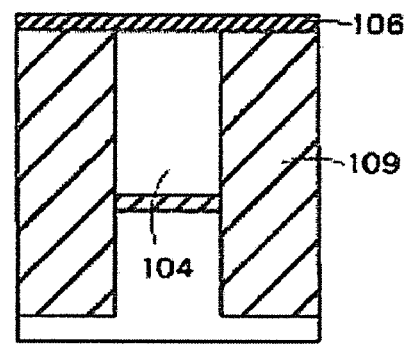

Thereafter, as shown in FIGS. 5E and 5F, as the inter-poly insulating film 106, a silicon nitride film having a thickness of 10 nm is deposited by, for example, a CVD method.

Figure 5G:
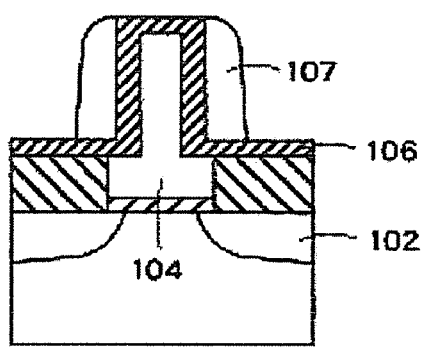
Figure 5H:
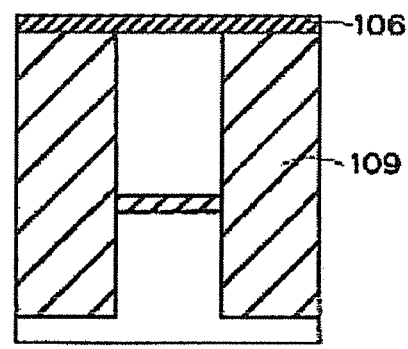

Then, as shown in FIGS. 5G and 5H, a polysilicon film, for example, is deposited thereon and etched back to leave portions exclusively on the side surfaces of the charge accumulation films 104. Thereby, the control gate electrodes 107 are formed.

In this way, it is possible to manufacture the nonvolatile semiconductor memory device according to this embodiment in which the control gate electrode is formed on each sidewall of the inverted-T floating gate electrodes.

Second Embodiment

Figure 6A:
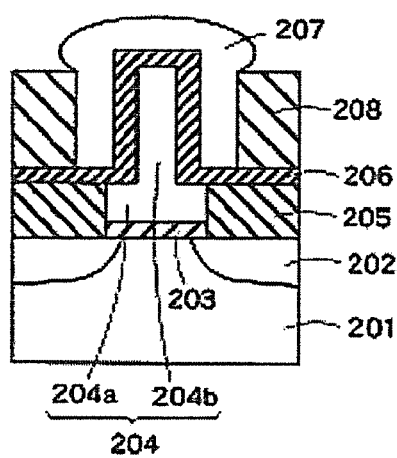
FIGS. 6A and 6B respectively show longitudinal sections taken in the bit-line and word-line directions of a nonvolatile semiconductor memory device according to a second embodiment of the present invention.
Figure 6B:
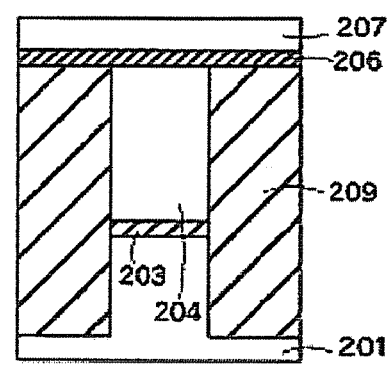

FIGS. 6A and 6B respectively show longitudinal sections taken in the bit-line and word-line directions of a nonvolatile semiconductor memory device according to a second embodiment of the present invention. On portions, between diffusion layers 202, of a semiconductor substrate 201, inverted-T floating gate electrodes 204 are formed with tunnel insulating films 203 interposed therebetween, respectively, as in the foregoing first embodiment. In addition, an inter-poly insulating film 206 is formed to cover the floating gate electrodes 204 and insulating films 205.

Each floating gate electrode 204 has a first portion 204a and a second portion 204b. The length in the bit-line direction of the first portion 204a is approximately the same as that of the tunnel insulating film 203 while that of the second portion 204b is shorter than this length.

In the foregoing first embodiment, the control gate electrodes 107 are formed on the sidewalls, in the bit-line direction, of the floating gate electrodes 104 with the inter-poly insulating films 106 interposed therebetween, respectively. In this embodiment, a control gate electrode 207 is formed to cover each of the upper surfaces and the side surfaces, in the bit-line direction, of the floating gate electrodes 204 with the inter-poly insulating film 206 interposed therebetween.

This structure allows components of a parasitic electric field generated by voltages applied to the control gate electrodes 207 to raise or lower the potentials of the diffusion layers 202, as in the foregoing first embodiment. Accordingly, short channel effect can be suppressed while a voltage difference between on/off discrimination currents can be reduced.

Additionally, since the cubic volume of the control gate electrodes (wordlines) 207 is increased over the foregoing first embodiment, the resistance value of each word line can be reduced in this embodiment.

Figure 7A:
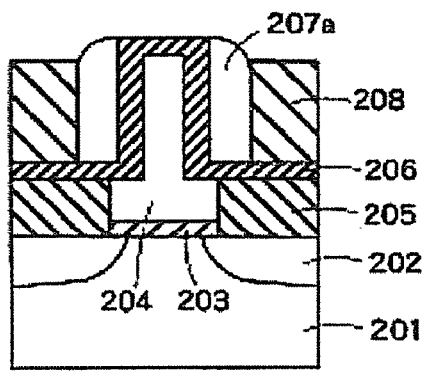
FIGS. 7A, 7C and 8A each show a longitudinal section taken in the bit-line direction while FIGS. 7B, 7D and 8B each show a longitudinal section taken in the word-line direction.

Hereinafter, a manufacturing method of the nonvolatile semiconductor memory device according to this embodiment will be described by using process sectional views shown in FIGS. 7A to 8B. FIGS. 7A, 7C and 8A each show a longitudinal section taken in the bit-line direction while FIGS. 7B, 7D and 8B each show a longitudinal section taken in the word-line direction. The steps till forming control gate electrodes 207a on the respective sidewalls of inverted-T shapes (floating gate electrodes) 204 into which the charge accumulation film is processed are similar to the foregoing first embodiment (equivalent to 4A to 5H), and thus description thereof will be omitted.

Figure 7B:
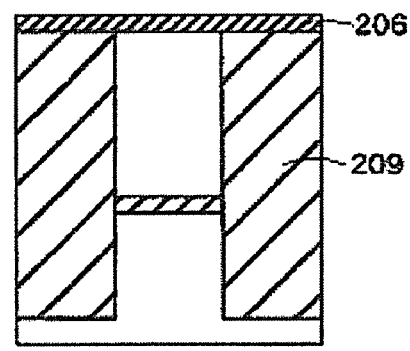
Figure 7C:
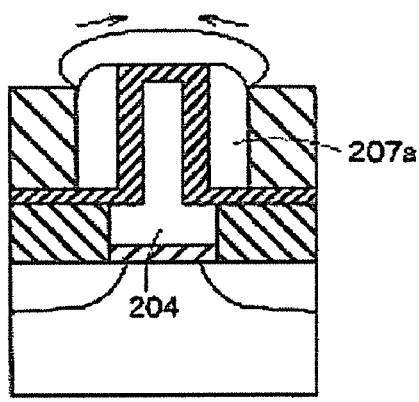
Figure 8A:
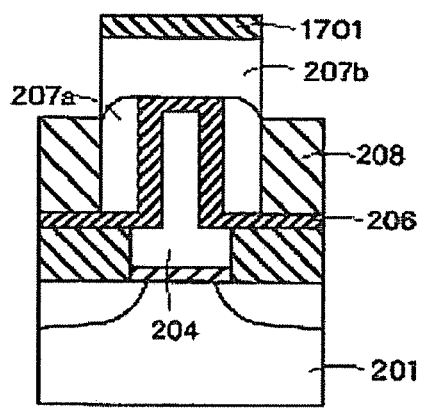

As shown in FIGS. 7A and 7B, an insulating film 208 made of, for example, a silicon dioxide film is deposited and processed so that upper portions of the control gate electrodes 207a can be exposed.

Figure 7D:
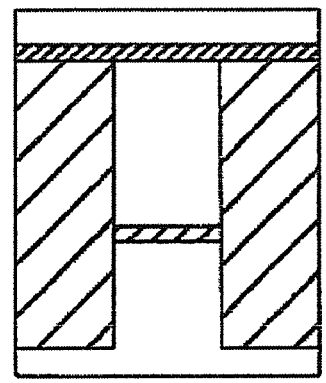

Then, as shown in FIGS. 7C and 7D, the control gate electrodes 207 formed on the side surfaces of each charge accumulation film 204 are connected to each other by, for example, epitaxial growth using a silane gas.

Figure 8B:
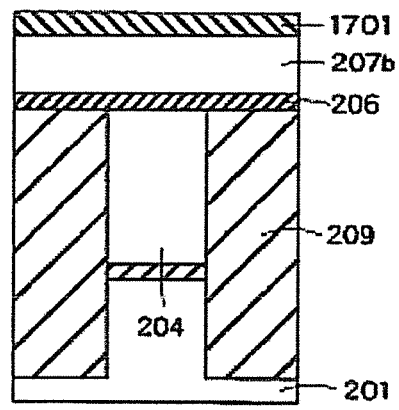

In this process, the control gate electrodes may not necessarily be formed by epitaxial growth. For example, after the step shown in FIGS. 7A and 7B, the step as shown in FIGS. 8A and 8B may be performed. Specifically, firstly, a polysilicon film 207b having phosphorus concentration of approximately $1 \times 10^{20}$ cm$^{-3}$ and an insulating film 1701 may be sequentially deposited. Then, the insulating film 1701 may be patterned to have band shapes extending in the word-line direction at predetermined intervals, and the polysilicon film 207b may be partially removed by RIE using the patterned insulating film 1701 as a mask.

In this way, it is possible to manufacture the nonvolatile semiconductor memory device according to this embodiment in which the control gate electrodes cover the sidewalls and upper surfaces of the inverted-T floating gate electrodes.

Third Embodiment

FIGS. 9A and 9B respectively show longitudinal sections taken in the bit-line and word-line directions of a nonvolatile semiconductor memory device according to a third embodiment of the present invention. In the upper surface of a semiconductor substrate 301, diffusion layers 302 are formed in the bit-line direction at predetermined intervals. On portions, between the diffusion layers 302, of a semiconductor substrate 301, inverted-T floating gate electrodes 304 are formed with tunnel insulating films 303 interposed therebetween, respectively.

Each floating gate electrode 304 has a first portion 304a and a second portion 304b. The length in the bit-line direction of the first portion 304a is approximately the same as that of the tunnel insulating film 303 while that of the second portion 304b is shorter than this length.

An insulating film 305 is formed on each diffusion layer 302. Between each adjacent two floating gate electrodes 304 in the word-line direction, formed is an element isolation region 309 having an STI structure of band shape extending in the bit-line direction. In addition, an inter-poly insulating film 306 is formed to cover the insulating films 305, the floating gate electrodes 304 and the element isolation regions 309. A control gate electrode 307 is formed to surround sidewalls of each floating gate electrode 304 with the inter-poly insulating film 306 interposed therebetween. An insulating film 308 is formed to cover the control gate electrodes 307 and the inter-poly insulating film 306.

FIG. 9C shows a horizontal section taken along the C-C' line of the FIGS. 9A and 9B. The longitudinal sections taken along the D-D' and E-E' lines of the FIG. 9C are equivalent to FIGS. 9A and 9B, respectively.

As in the foregoing first embodiment, the control gate electrodes 307 are respectively formed on the sidewalls of the floating gate electrodes 304 in this embodiment. This structure allows components of a parasitic electric field generated by voltages applied to the control gate electrodes 307 to raise or lower the potentials of the diffusion layers 302. Accordingly, short channel effect can be suppressed while a voltage difference between on/off discrimination currents can be reduced.

Additionally, the control gate electrodes 307 are formed on all the sidewalls, in the bit-line and word-line directions, of the floating gate electrodes 304 in this embodiment, unlike the foregoing first embodiment in which the control gate electrodes 107 are formed only on the sidewalls, in the bit-line direction, of the floating gate electrodes 104. This structure can suppress parasitic gate effect from adjacent cells. In addition, since a coupling area between each floating gate electrode and the adjacent control gate electrodes can be increased, the height of the floating gate electrode can be reduced with a coupling ratio maintained therein.

Hereinafter, a manufacturing method of the nonvolatile semiconductor memory device according to this embodiment will be described by using process sectional views shown in FIGS. 10A to 10H. FIGS. 1A, 10C, 10E and 10G each show a longitudinal section taken in the bit-line direction while FIGS. 10B, 10D, 10E and 10F each show a longitudinal section taken in the word-line direction. The step still processing a charge accumulation film (floating gate electrodes) 304 to have inverted-T shapes by side etching are similar to the foregoing first embodiment (equivalent to 4A to 5D), and thus description thereof will be omitted.

As shown in FIGS. 10A and 10B, element isolation regions 309 are etched back, and thereafter, as an inter-poly insulating film 306, a silicon nitride film having a thickness of 10 nm is deposited by, for example, a CVD method to cover the upper surfaces of the element isolation regions 309, the upper surfaces of insulating films 305 and the upper and side surfaces of the charge accumulation films 304.

Then, as shown in FIGS. 10C and 10D, a polysilicon film, for example, is deposited thereon and etched back to leave portions exclusively on all the side surfaces of the charge accumulation films 304. Thereby, first control gate electrodes 307a are formed.

Figure 10E:
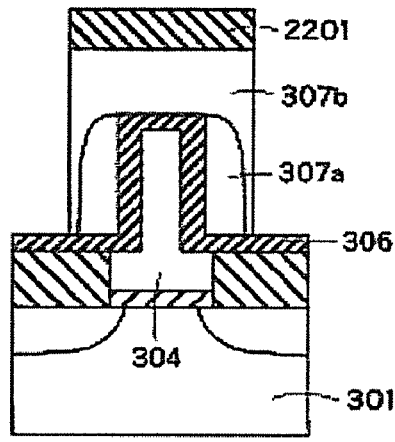
FIGS. 10A, 10C, 10E and 10G each show a longitudinal section taken in the bit-line direction while FIGS. 10B, 10D, 10F and 10H each show a longitudinal section taken in the word-line direction.
Figure 10F:
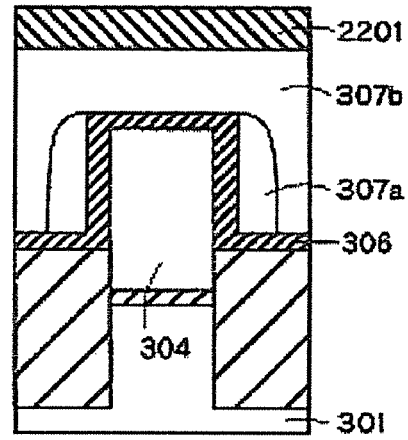

Thereafter, as shown in FIGS. 10E and 10F, a polysilicon film 307b and an insulating film 2201, for example, are sequentially deposited. Then, the insulating film 2201 is patterned to have band shapes extending in the word-line direction at predetermined intervals, and the polysilicon film 307b is partially removed by RIE using the patterned insulating film 2201 as a mask.

Figure 10G:
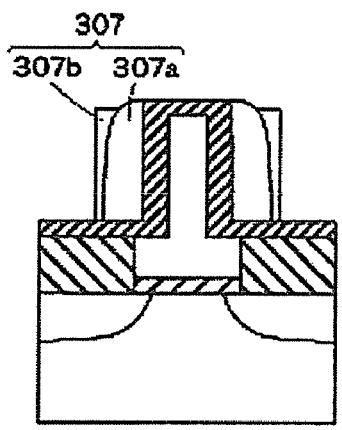
Figure 10H:
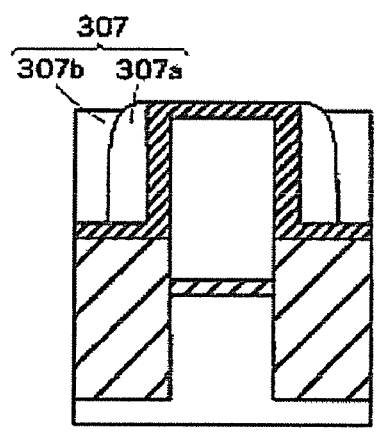

Then, as shown in FIGS. 10G and 10H, the polysilicon films 307b are processed so that the inter-poly insulating films 306 can be exposed in regions above the floating gate electrodes 304, and thereby the control gate electrodes 307 are formed. After that, an insulating film 308 (not shown) is formed to cover the control gate electrodes 307 and the inter-poly insulating film 306.

In this way, it is possible to manufacture the nonvolatile semiconductor memory device according to this embodiment in which the control gate electrodes are formed over all the side surfaces of the inverted-T floating gate electrodes.

Note that the RIE process for exposing the inter-poly insulating films 306 in regions above the floating gate electrodes 304 shown in FIGS. 10G and 10H may be skipped. In this case, as shown in FIGS. 10E and 10F, the control gate electrodes are formed over all the sidewalls and the upper surfaces of the inverted-T floating gate electrodes. This structure allows further increase in a coupling area between each floating gate electrode and the adjacent control gate electrodes, and thus further reduction in the height of the floating gate electrode while maintaining a coupling ratio therein.

Fourth Embodiment

Figure 11:
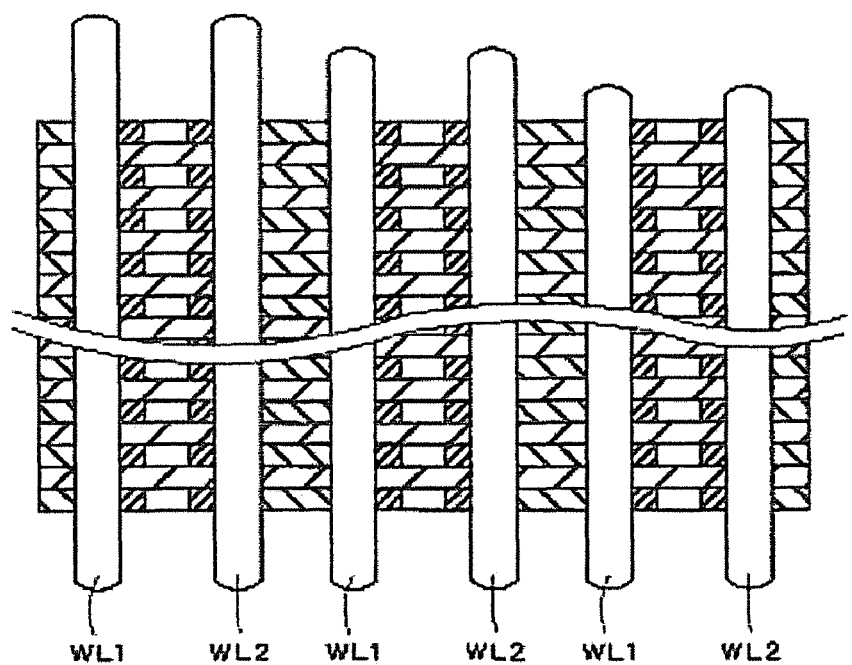
FIG. 11 is an overall view of a horizontal section of a nonvolatile semiconductor memory device according to a fourth embodiment of the present invention.

FIG. 11 is an overall view of a horizontal section of a nonvolatile semiconductor memory device according to a fourth embodiment of the present invention. In the nonvolatile semiconductor memory device according to this embodiment, end portions of each two word lines WL1 and WL2 as in nonvolatile semiconductor memory device according to the foregoing first embodiment shown in FIG. 2 are cut off, and thereby the word lines WL1 and WL2 are capable of applying-different voltages from each other. In other words, in this structure, each floating gate electrode has two control gate electrodes capable of applying different voltages from each other.

Figure 12A:
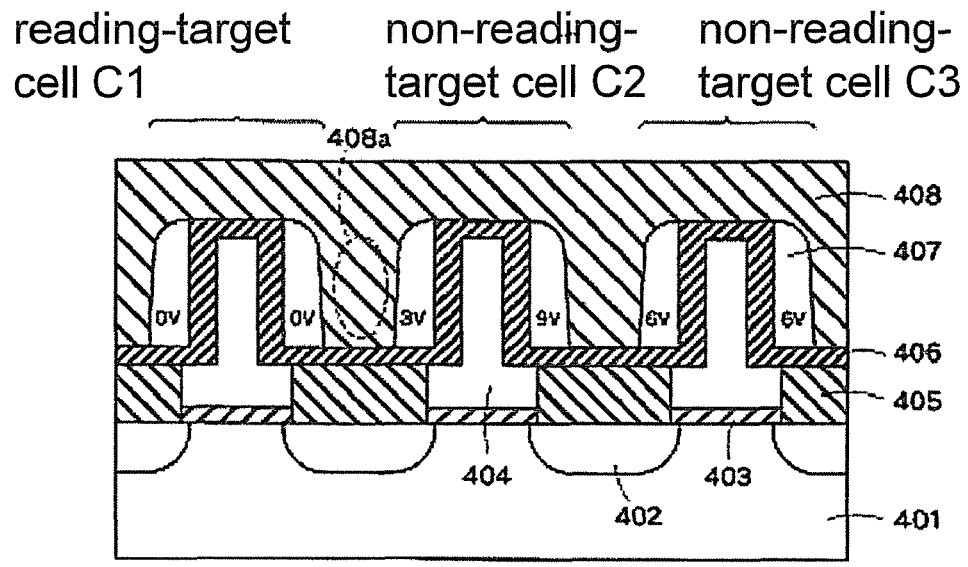
FIG. 12A shows an example of voltages applied to the nonvolatile semiconductor memory device during a reading operation and FIG. 12B shows an example of a single voltage applied to the nonvolatile semiconductor memory device during a reading operation.

FIG. 12A shows an example of voltages applied to the nonvolatile semiconductor memory device during a reading operation. A voltage of 0 V is applied to each control gate electrode 407 of a reading-target cell C1. Meanwhile, in a non-reading-target cell C2, a voltage of 3 V is applied to the control gate electrode 407 closer to the reading-target cell C1 while a voltage of 9 V is applied to the control gate electrode 407 closer to a non-reading-target cell C3. A voltage of 6 V is applied to each control gate electrode 407 of the non-reading-target cell C3. Here, a reading voltage Vread is set to 6 V.

Figure 12B:
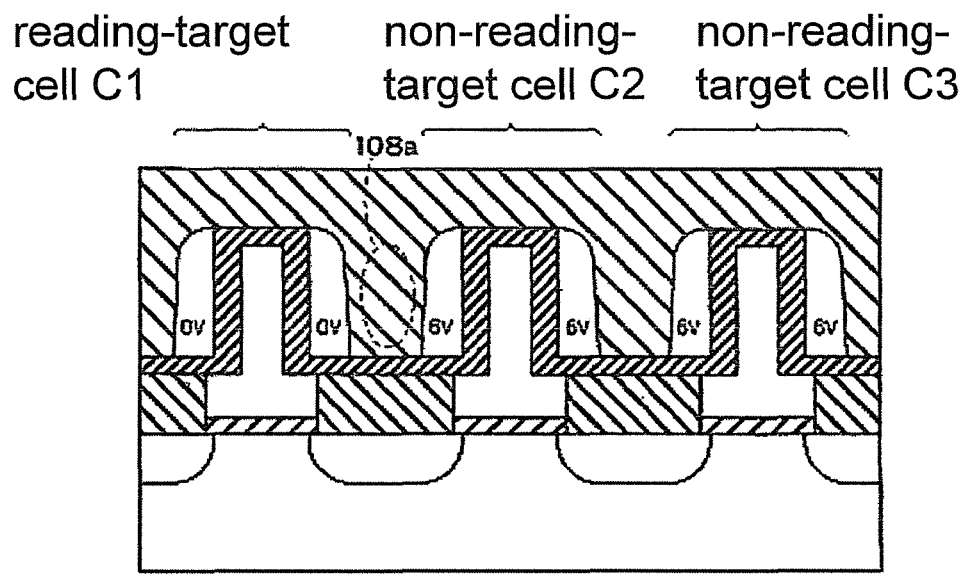
Figure 13:
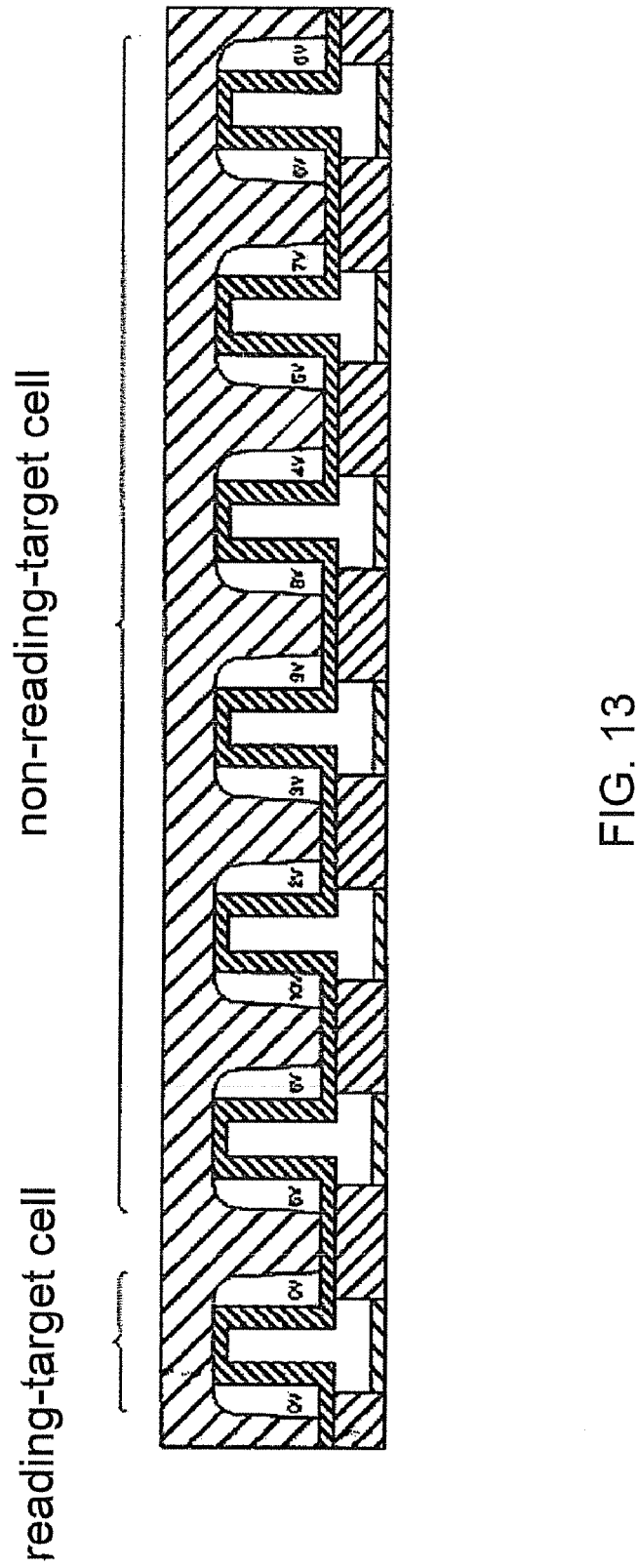
FIG. 13 shows an example of voltages applied to the nonvolatile semiconductor memory device during a reading operation.

In this example, a voltage applied on an insulating film 408a between the cells C1 and C2 is 3 V. If a single voltage were applied to the two control gate electrodes of each cell as in the foregoing first embodiment, a voltage applied on the insulating film 408a between the adjacent control gate electrodes of the reading-target cell C1 and the non-reading-target cell C2 would be 6 V, as shown in FIG. 12B.

In other words, in the nonvolatile semiconductor memory device according to this embodiment, a reduced voltage can be applied on an insulating film between the adjacent two control gate electrodes of each reading-target cell and the adjacent non-reading-target cell. Accordingly, insulating film destruction can be prevented.

For example, assume that voltages with 1 V increments from 0 V to 11 V can be applied to the control gate electrodes with the reading voltage Vread of 6 V. In this case, the voltages should be preferably applied to the control gate electrodes so that a potential difference between each facing two control gate electrodes can be small and that the voltages gradually come closer to Vread as being distant from the reading-target cell.

As described above, the nonvolatile semiconductor memory device according to this embodiment is capable of suppressing short channel effect and reducing a voltage difference between on/off discrimination currents therein. In addition, the nonvolatile semiconductor memory device according to this embodiment is capable of preventing destruction of an insulating film in a region between each facing two control gate electrodes, and thus has an improved reliability.

Figures 14A, 14B:
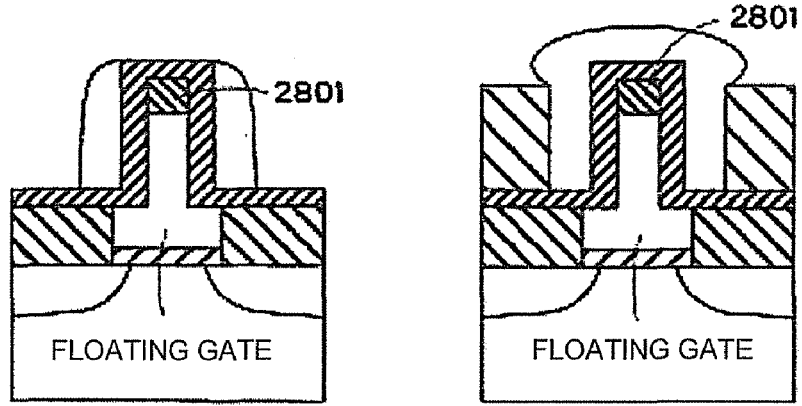
FIGS. 14A, 14B, 15A and 15B are modification of the embodiment in accordance with the present invention.

It should be understood that each of the foregoing embodiments is only an example, and thus not limits the present invention. For example, the present invention may be implemented as a structure in which an insulating film 2801 is formed on each inverted-T floating gate electrode as show in FIGS. 14A and 14B. This structure can be obtained when the insulating film used as a mask in side etching the floating gate electrodes is left instead of being peeled off.

This structure prevents concentration of electrical flux lines from the control gate electrodes to upper end portions of the floating gate electrodes, and thus can prevent leakage in the inter-poly insulating film and destruction thereof.

Figure 15A:
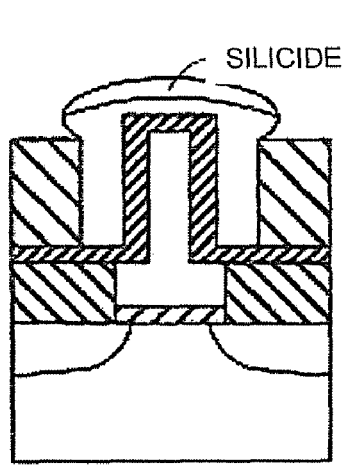
Figure 15B:
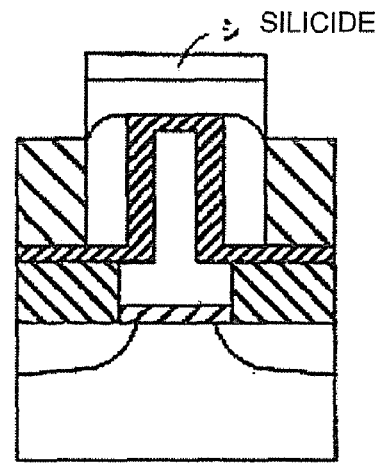

Moreover, in the foregoing second embodiment, a portion, above the corresponding floating gate electrode, of each control gate electrode may be silicided by using metals such as Ni, Ti or NiPt as shown in FIGS. 15A and 15B. This allows further reduction in the resistance value of each word line.

In addition, the control gate electrodes, though formed of a polysilicon film in the foregoing embodiments, may be formed of a metal. This prevents depletion of the control gate electrodes formed on the sidewalls of the floating gate electrode, even when the control gate electrodes are miniaturized.

Moreover, the inter-poly insulating film need not always be a silicon nitride film, but may be a multi-layer film or a High-k film.

Figure 16:
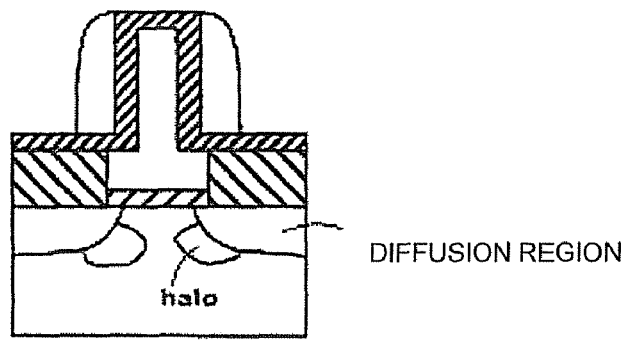
FIG. 16 shows an example of halos formed with formation of diffusion layers.

Halos may be formed simultaneously with formation of diffusion layers as shown in FIG. 16. This efficiently suppresses source-to-drain current leakage.

Moreover, no diffusion layer may be formed in the upper surface of the semiconductor substrate.

Furthermore, a silicon on insulator (SOI) substrate or a partial SOI substrate (a substrate partially having a SOI structure) may be employed. Employment of such a substrate allows further suppression of short channel effect. Accordingly, impurity concentration in a substrate of each cell can be reduced, and consequently threshold voltage variation can be suppressed.

Embodiments of the invention have been described with reference to the examples. However, the invention is not limited thereto.

Other embodiments of the present invention will be apparent to those skilled in the art from consideration of the specification and practice of the invention disclosed herein. It is intended that the specification and example embodiments be considered as exemplary only, with a true scope and spirit of the invention being indicated by the following.

What is claimed is:

1. A nonvolatile semiconductor memory device, comprising:
a gate insulation film disposed on a semiconductor substrate;
a plurality of floating gate including first portions which are periodically arranged in a first direction on the same plane of the substrate and which contact the gate insulation film and whose sectional shapes cut by a plane including directions parallel to the first direction and vertical to the substrate are rectangular, and second portions which are positioned in middle portions of the first portions and whose sectional shapes cut by a plane including directions parallel to the first direction and vertical to the substrate are rectangular and whose lengths in the direction parallel to the first direction are smaller than those of the first portions;
a plurality of control gates including third portions which are periodically arranged in the first direction in such a manner that the third portions are positioned between the plurality of floating gates and on side surfaces of the floating gates positioned on opposite end portions of the arrangement of the plurality of floating gates and which are positioned between the second portion of a pair of adjacent floating gates; and
an inter-gate insulating film disposed to insulate between each of the plurality of floating gates and each of the plurality of control gates and between each of the plurality of control gates and the substrate,
wherein a plurality of memory cells each constituted of each of the plurality of floating gates and a pair of control gates positioned on opposite sides of the floating gate are arranged, a pair of adjacent memory cells do not share one control gate positioned between the memory cells, and each floating gate is driven by capacitor coupling between the pair of control gates positioned on the opposite sides of each floating gate in each memory cell, and the plurality of control gates are not provided in a region between the first portions of the plurality of floating gates in the first direction.

2. The nonvolatile semiconductor memory device according to claim 1, wherein the pair of control gate are electrically separated from each other and capable of applying different voltages from each other.

3. The nonvolatile semiconductor memory device according to claim 1, wherein the plurality of floating gate have an inverted-T shape in a cross sectional view taken along the first direction.

4. The nonvolatile semiconductor memory device according to claim 1, wherein a part of the first control gate and a part of the second gate are provided above the first portion of the floating gate included in the plurality of floating gates.

5. The nonvolatile semiconductor memory device according to claim 1, wherein a part of the first control gate and a part of the second control gate are provided outside of the first portion of the floating gate included in the plurality of floating gates.

6. The nonvolatile semiconductor memory device according to claim 1, further comprising:
a plurality of tunnel insulating films formed on the semiconductor substrate at predetermined intervals in a first direction;
an insulating film formed to cover the pair of control gates and the inter-gate insulating film;
wherein distance between two control gate facing each other with the insulating film interposed therebetween is shorter than that between each two tunnel insulating films facing each other with the insulating film interposed therebetween.

7. The nonvolatile semiconductor memory device according to claim 2, wherein the plurality of floating gate have an inverted-T shape in a cross sectional view taken along the first direction.

8. The nonvolatile semiconductor memory device according to claim 7, wherein a part of the first control gate and a part of the second control gate are provided above the first portion of the floating gate included in the plurality of floating gates.

9. The nonvolatile semiconductor memory device according to claim 3, wherein a part of the first control gate and a part of the second control gate are provided above the first portion of the floating gate included in the plurality of floating gates.

10. The nonvolatile semiconductor memory device further comprising:
a gate insulating film disposed on a semiconductor substrate;
a plurality of tunnel insulating films formed on the semiconductor substrate at predetermined interval in a first direction;
a plurality of floating gate including first portions which are periodically arranged in the first direction on the same plane of the substrate and which contact the gate insulation film and whose sectional shapes cut by a plane including directions parallel to the first direction and vertical to the substrate are rectangular, and second portions which are positioned in middle portions of the first portions and whose sectional shapes cut by a plane including directions parallel to the first direction and vertical to the substrate are rectangular and whose lengths in the direction parallel to the first direction are smaller than those of the first portions;
a plurality of control gates including third portions which are periodically arranged in the first direction in such a manner that the third portions are positioned between the plurality of floating gates and on side surfaces of the floating gates positioned on opposite end portions of the arrangement of the plurality of floating gates and which are positioned between the second portion of a pair of adjacent floating gates; and
an inter-gate insulating film disposed to insulate between each of the plurality of floating gates and each of the plurality of control gates and between each of the plurality of control gates and the substrate,
wherein a plurality of memory cells each constituted of each of the plurality of floating gates and a pair of control gates positioned on opposite sides of the floating gate are arranged, a pair of adjacent memory cells share one control gate positioned between the memory cells, and each floating gate is driven by capacitor coupling between the pair of control gates positioned on the opposite sides of each floating gate in each memory cell, further comprising,
an insulating film formed to cover the pair of control gates and the inter-gate insulating film, wherein a distance between two control gates facing each other with the insulating film interposed therebetween is shorter than that between each two tunnel insulating films facing each other with the insulating film interposed therebetween.

11. The nonvolatile semiconductor memory device according to claim 10, wherein a part of the first control gate and a part of the second control gate are provided above the first portion of a floating gate included in the plurality of floating gate.

12. A nonvolatile semiconductor memory device, comprising:
- a semiconductor substrate;
- a plurality of tunnel insulating films formed on the semiconductor substrate at predetermined intervals in a first direction;
- a plurality of floating gate electrodes each having a first portion and a second portion, the first portions being formed on the respective tunnel insulating films, the second portions being formed on the respective first portions and having smaller width than the first portions in the first direction;
- an inter-gate insulating film formed on the floating gate electrodes; and
- a plurality of control gate electrode, each formed over a top and sidewalls, in the first direction, of the second portion of each of the plurality of floating gate electrodes with the inter-gate insulating film interposed therebetween, the plurality of control gate electrode having a band shape extending in a second direction perpendicular to the first direction,
- wherein the plurality of control gate electrodes are not provided in a region between the first portion of the plurality of floating gate electrodes in the first direction, and protrude transversely over the plurality of floating gate electrodes.

13. The nonvolatile semiconductor memory device according to claim 12, wherein the plurality of control gate electrode is formed to cover sidewalls, in the second direction, of the second portion of each of the plurality of floating gates electrodes with the inter-gate insulating film interposed therebetween.

14. The nonvolatile semiconductor memory device according to claim 12, wherein the plurality of floating gate electrode has an inverted-T shape in a cross sectional view taken along the first direction.

15. The nonvolatile semiconductor, memory device according to claim 12, wherein a part of the first control gate electrode and a part of the second control gate electrode are provided above the first portion of the plurality of floating gate electrode.

16. The nonvolatile semiconductor, memory device according to claim 12, wherein a part of the first control gate electrode and a part of the second control gate electrode are provided outside the first portion of the plurality of floating gate electrode.

17. The nonvolatile semiconductor memory device according to claim 13, wherein the plurality of floating gate electrodes have an inverted-T shape in a cross sectional view taken along the first direction.

18. The nonvolatile semiconductor memory device according to claim 17, wherein a part of the first control gate electrode and a part of the second control gate electrode are provided above the first portion of the plurality of floating gate electrode.

19. The nonvolatile semiconductor memory device according to claim 14, wherein a part of the first control gate electrode and a part of the second control gate electrode are provided above the first portion of the plurality of floating gate electrode.

20. A nonvolatile semiconductor memory device, comprising:
- a semiconductor substrate;
- a plurality of tunnel insulating films formed on the semiconductor substrate at predetermined intervals in a first direction;
- a plurality of floating gate electrodes each having a first portion and a second portion, the first portions being formed on the respective tunnel insulating films, the second portions being formed on the respective first portions and having smaller width than the first portions in the first direction;
- an inter-gate insulating film formed on the floating gate electrodes; and
- a plurality of control gate electrode, each formed over a top and sidewalls, in the first direction, of the second portion of each of the plurality of floating gate electrodes with the inter-gate insulating film interposed therebetween, the plurality of control gate electrode having a band shape extending in a second direction perpendicular to the first direction; and
- an insulating film formed to cover the plurality of control gate electrodes and the inter-face insulating film,
- wherein a distance between two control gate electrodes facing each other with the insulating film interposed therebetween is shorter than that between each two tunnel insulating films facing each other with the insulating film interposed therebetween.

* * * * *